US008044595B2

(12) United States Patent
Nitschke

(10) Patent No.: US 8,044,595 B2
(45) Date of Patent: Oct. 25, 2011

(54) OPERATING A PLASMA PROCESS

(75) Inventor: Moritz Nitschke, Freiburg (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 359 days.

(21) Appl. No.: 12/471,769

(22) Filed: May 26, 2009

(65) Prior Publication Data

US 2009/0289034 A1    Nov. 26, 2009

Related U.S. Application Data

(63) Continuation of application No. PCT/EP2007/010176, filed on Nov. 23, 2007.

(60) Provisional application No. 60/867,159, filed on Nov. 24, 2006.

(30) Foreign Application Priority Data

Nov. 23, 2006    (EP) .................................... 06024306

(51) Int. Cl.
*C23C 14/34*    (2006.01)
(52) U.S. Cl. ......... 315/111.21; 204/298.08; 204/298.06; 204/192.15
(58) Field of Classification Search ............. 315/111.21, 315/111.31, 111.51, 160, 161, 167, 169.1–169.4; 204/298.06–298.32, 192.15, 192.13, 192.16; 323/65–72, 50–58; 361/2; 333/99 PL
See application file for complete search history.

(56) References Cited

U.S. PATENT DOCUMENTS

| 4,031,464 A | 6/1977 | Norberg |
| 4,396,478 A | 8/1983 | Aizenshtein et al. |
| 4,588,952 A | 5/1986 | Matsuoka |
| 4,625,283 A | 11/1986 | Hurley |
| 4,629,940 A | 12/1986 | Gagne et al. |
| 4,694,402 A | 9/1987 | McEachern et al. |
| 4,936,960 A | 6/1990 | Siefkes et al. |
| 5,192,894 A | 3/1993 | Teschner |
| 5,241,152 A | 8/1993 | Anderson et al. |
| 5,543,689 A | 8/1996 | Ohta et al. |

(Continued)

FOREIGN PATENT DOCUMENTS

DE    4127504    2/1993

(Continued)

OTHER PUBLICATIONS

Ochs et al., "Advanced Power Supplies designed for Plasma Deposition and Etching", Vakuum In Forschung und Praxis, vol. 8, No. 5, Sep. 26, 2006, pp. 32-36.

(Continued)

*Primary Examiner* — Douglas W Owens
*Assistant Examiner* — Amy Yang
(74) *Attorney, Agent, or Firm* — Fish & Richardson P.C.

(57) ABSTRACT

A method for operating one or more plasma processes in a plasma chamber, with at least two power supplies, the method comprising the following process steps:
  a. carrying out an arc detection for at least one of the power supplies;
  b. generating at least one signal relating to the arc detection and/or data relating to the arc detection;
transferring the at least one signal and/or the data to a plasma process-regulating device and/or to one or more other power supplies or to one or more of the arc diverter devices associated with the other power supplies.

20 Claims, 2 Drawing Sheets

U.S. PATENT DOCUMENTS

| | | |
|---|---|---|
| 5,576,939 A | 11/1996 | Drummond |
| 5,611,899 A * | 3/1997 | Maass ............... 204/298.08 |
| 5,698,082 A | 12/1997 | Teschner et al. |
| 5,718,813 A | 2/1998 | Drummond et al. |
| 5,729,145 A | 3/1998 | Blades |
| 5,804,975 A | 9/1998 | Alers et al. |
| 5,889,391 A | 3/1999 | Coleman |
| 5,993,615 A | 11/1999 | Abry et al. |
| 6,007,879 A | 12/1999 | Scholl |
| 6,060,837 A | 5/2000 | Richardson et al. |
| 6,063,245 A * | 5/2000 | Frach et al. ............ 204/192.15 |
| 6,162,332 A | 12/2000 | Chiu |
| 6,213,050 B1 | 4/2001 | Liu et al. |
| 6,222,321 B1 * | 4/2001 | Scholl et al. ............ 315/111.21 |
| 6,332,961 B1 | 12/2001 | Johnson et al. |
| 6,416,638 B1 | 7/2002 | Kuriyama et al. |
| 6,420,863 B1 | 7/2002 | Milde et al. |
| 6,472,822 B1 | 10/2002 | Chen et al. |
| 6,535,785 B2 | 3/2003 | Johnson et al. |
| 6,545,420 B1 | 4/2003 | Collins et al. |
| 6,621,674 B1 | 9/2003 | Zahringer et al. |
| 6,633,017 B1 | 10/2003 | Drummond et al. |
| 6,736,944 B2 | 5/2004 | Buda |
| 6,740,207 B2 | 5/2004 | Kloeppel et al. |
| 6,753,499 B1 | 6/2004 | Yasaka et al. |
| 6,783,795 B2 | 8/2004 | Inoue et al. |
| 6,791,274 B1 | 9/2004 | Hauer et al. |
| 6,859,042 B2 | 2/2005 | Parker |
| 6,878,248 B2 | 4/2005 | Signer et al. |
| 6,943,317 B1 | 9/2005 | Ilic et al. |
| 6,967,305 B2 | 11/2005 | Sellers |
| 7,016,172 B2 | 3/2006 | Escoda |
| 7,081,598 B2 | 7/2006 | Ilic et al. |
| 7,262,606 B2 | 8/2007 | Axenbeck et al. |
| 7,301,286 B2 | 11/2007 | Kuriyama |
| 7,408,750 B2 | 8/2008 | Pellon et al. |
| 2004/0031699 A1 | 2/2004 | Shoji |
| 2004/0079733 A1 | 4/2004 | Kawaguchi et al. |
| 2004/0182697 A1 * | 9/2004 | Buda ............... 204/298.08 |
| 2004/0212312 A1 | 10/2004 | Chistyakov |
| 2005/0051270 A1 | 3/2005 | Sasaki et al. |
| 2005/0093459 A1 | 5/2005 | Kishinevsky |
| 2005/0135025 A1 | 6/2005 | Escoda |
| 2006/0011473 A1 | 1/2006 | Kuriyama et al. |
| 2006/0054601 A1 | 3/2006 | Ilic et al. |
| 2006/0100824 A1 | 5/2006 | Moriya |
| 2006/0181816 A1 | 8/2006 | Pellon et al. |
| 2006/0213761 A1 | 9/2006 | Axenbeck et al. |
| 2007/0073498 A1 | 3/2007 | Winterhalter et al. |
| 2007/0121267 A1 | 5/2007 | Kotani et al. |
| 2007/0168143 A1 | 7/2007 | Axenbeck et al. |
| 2007/0251813 A1 | 11/2007 | Ilic et al. |
| 2008/0121517 A1 | 5/2008 | Nitschke |
| 2008/0121625 A1 | 5/2008 | Zaehringer |
| 2008/0122369 A1 | 5/2008 | Nitschke |
| 2008/0133154 A1 | 6/2008 | Krauss |
| 2008/0216745 A1 | 9/2008 | Wiedemuth et al. |
| 2008/0218923 A1 | 9/2008 | Wiedemuth |
| 2008/0257869 A1 | 10/2008 | Nitschke et al. |

FOREIGN PATENT DOCUMENTS

| | | |
|---|---|---|
| DE | 43 26 100 | 2/1995 |
| DE | 44 20 951 | 12/1995 |
| DE | 19651615 | 7/1997 |
| DE | 19849636 | 5/2000 |
| DE | 10034895 | 2/2002 |
| DE | 10119058 | 10/2002 |
| DE | 102004015090 | 11/2005 |
| DE | 102006002333 | 7/2007 |
| EP | 0713242 | 5/1996 |
| EP | 0 967 697 | 12/1999 |
| EP | 0 692 138 | 1/2004 |
| EP | 1 441 576 | 7/2004 |
| EP | 1705687 | 9/2006 |
| EP | 1720195 | 11/2006 |
| JP | 06132095 | 5/1994 |
| JP | 08-167500 | 6/1996 |
| JP | 08222398 | 8/1996 |
| JP | 09170079 | 6/1997 |
| JP | 2000117146 | 4/2000 |
| JP | 2005077248 | 3/2005 |
| WO | WO 94/25977 | 11/1994 |
| WO | WO 01/13402 | 2/2001 |
| WO | WO 03/037047 | 5/2003 |
| WO | WO 03/088445 | 10/2003 |
| WO | WO 2006/014212 | 2/2006 |
| WO | WO 2006/116445 | 11/2006 |

OTHER PUBLICATIONS

Van Zyl et al., "Managing Arcs in RF Powered Plasma Processes", Society of Vacuum Coaters, 48th Annual Technical Conference Proceedings, 2005, pp. 44-49.

Zlatanovic et al., "Glow-to-Arc Transition Instability Sensor in Processing Plasma", Proc. 20th International Conference on Microelectronics, vol. 2, Sep. 12-14, 1995, pp. 597-600.

International Search Report from corresponding PCT Application No. PCT/EP2007/010176, Mar. 5, 2008, 3 pages.

English Translation of Notification of Transmittal of Translation of the International Preliminary Report on Patentability from corresponding PCT Application No. PCT/EP2007/010176, Jun. 10, 2009, 13 pages.

Translation of Office Action from correspondence Japanese Application No. 2007-504279, dated Sep. 28, 2009, 4 pages.

* cited by examiner

OPERATING A PLASMA PROCESS

CROSS REFERENCE TO RELATED APPLICATIONS

This application is a continuation of and claims priority under 35 U.S.C. §120 to PCT Application No. PCT/EP2007/010176, filed on Nov. 23, 2007, which claimed priority to European Application No. EP 06 024 306.0, filed on Nov. 23, 2006 and U.S. Provisional Application Ser. No. 60/867,159, filed Nov. 24, 2006. The contents of PCT Application No. PCT/EP2007/010176 are hereby incorporated by reference in their entirety.

TECHNICAL FIELD

The present invention relates to a method for operating a plasma process or a plurality of plasma processes, with at least two power supplies, as well as a plasma system for carrying out the method.

BACKGROUND

Plasma processes occur, for example, in plasma processing and coating devices. A great number of different plasma processing devices are known, for example, PVD, PECVD, etching or even gas laser excitation. One form of such a device is also known in general terms as a sputtering system on account of the sputtering process used. In particular in the case of dc sputtering installations, flash-overs, where a current seeks an electrically conductive path in the plasma, are a frequent occurrence. Such flash-overs occur relatively frequently, in particular during what is known as reactive coating of a substrate. The reason for this is the fact that in addition to the substrate itself, parts of the sputtering system, such as the inner wall of the process chamber, are coated with electrically non-conducting or only poorly electrically conducting materials, which then charge up to a breakdown voltage. To avoid undue damage to the sputtering systems, the supply of current of a plasma dc voltage supply is switched off or briefly interrupted as soon as possible during the occurrence of a flash-over, or a voltage across the plasma chamber is short-circuited or its polarity is reversed. In order to be able to initiate the above-mentioned measures at all, devices for arc discharge detection (arc detection) and also for suppressing or extinguishing the arc discharges (arcs), are in many cases an integral part of the plasma current supply or plasma dc voltage supply, i.e. the plasma power supply.

In the first instance, it is important that arc discharges or arcs are reliably detected. An arc discharge can be detected, for example, by a voltage dip or voltage drop or by a current rise at the output of the plasma dc voltage supply. In other words, an arc discharge detection (arc detection) can be implemented by monitoring at least one suitable characteristic value of the plasma process, such as one of the above-mentioned electrical characteristic values.

In addition to what are called "hard arcs", which may lead to damage of the sputtering system and to defects in a substrate to be machined, in particular also what are commonly termed "short arcs" are known (arcs that are relatively strongly defined, but in contrast to hard arcs are self-extinguishing) and what are commonly termed "micro-arcs" (hereafter also referred to as micro arc discharges or micro arcs). Depending on the setting of the threshold for arc discharge detection, such micro arc discharges, when they extinguish themselves again, are generally not detected at all by the known methods and devices. However, it is known that such micro arc discharges can become amplified and can then lead to a more serious short arc or hard arc.

To preclude this happening, it is known, for example, from EP 0 692 138 B1, to reverse the polarity of the voltage supply periodically for a predefinable short time to discharge any charges in the plasma chamber. This is also referred to as DC pulsed operation. Compared with a continuous plasma process, arcing is often clearly reduced with this operation, but the coating or ablation rate is likewise reduced.

SUMMARY

The invention addresses a need for providing a method and a system with which uniform plasma process conditions combined with high coating or etching rates can be achieved.

In a first aspect, the invention relates to a method for operating one or more plasma processes in a plasma chamber, with at least two power supplies and comprising the following method steps:
  a. carrying out an arc detection for at least one of the power supplies;
  b. generating at least one signal relating to the arc detection and/or data relating to the arc detection;
  c. transferring the at least one signal and/or the data to a plasma process-regulating device and/or to one or more other power supplies and/or to one or more arc diverter devices associated with the other power supplies.

In a further aspect, the invention relates to a plasma system for carrying out the method according to the invention, having at least two power supplies, a plasma chamber and at least one arc detection device, which is assigned to one of the power supplies, the power supplies being connected via a signal link and/or data link to one another and/or to a plasma process-regulating device.

Further features and advantages of the invention are apparent from the following description of exemplary embodiments of the invention with the help of the Figures of the drawings showing important features of the invention, and from the claims. The individual features can be realized separately or jointly in any combination in a variant of the invention.

DETAILED DESCRIPTION

Figure 1:
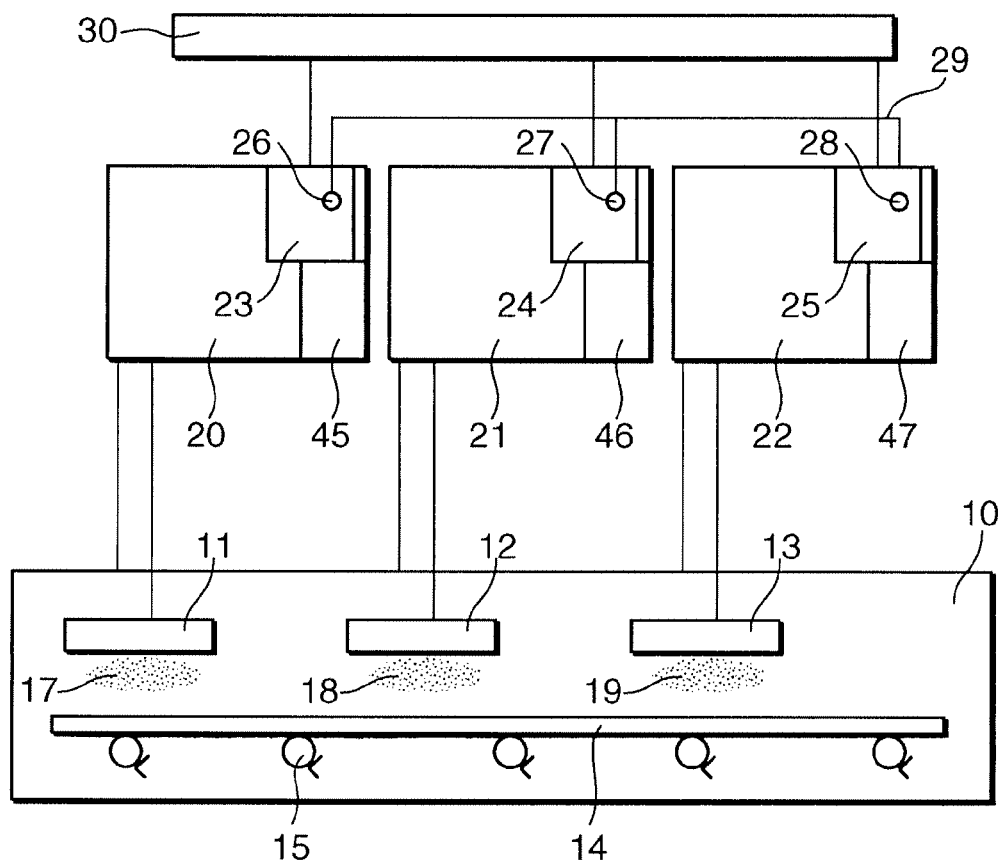
FIG. 1 shows a schematic representation of a plasma system.

In a first aspect, the invention relates to a method for operating one or more plasma processes in a plasma chamber, with at least two power supplies and comprising the following method steps:
  a. carrying out an arc detection for at least one of the power supplies;
  b. generating at least one signal relating to the arc detection and/or data relating to the arc detection;
  c. transferring the at least one signal and/or the data to a plasma process-regulating device and/or to one or more other power supplies and/or to one or more arc diverter devices associated with the other power supplies.

With this method, several power supplies can be synchronized with one another and/or be included in the overall control of a plasma process. For example, the OFF times or polarity-reversal times of the individual power supplies can be harmonized with one another, so that very frequent interruption of the supplied power does not occur at one point of the plasma process, while infrequent interruption of the supplied power occurs at a different point. In particular, the power supplies are able to communicate with one another and harmonize the countermeasures to be implemented in each case, which are intended to prevent the development of "short arcs" or "hard arcs". A signal relating to the arc detection is, for example, a signal that initiates a counter-measure or an arc detection signal. It may alternatively, however, be a signal that indicates that a counter-measure has already been implemented. In addition, it may be a signal that indicates that a certain number of arcs or certain type of arcs, for example, micro arcs, has occurred. Data relating to the arc detection may be, inter alia, the number and/or duration of counter-measures, the blocking time that elapses before a counter-measure is implemented, or the frequency of the occurrence of arcs or the type of arcs, for example, micro arcs. Signals or data that are connected with a counter-measure are in terms of the invention accordingly also signals respectively data that relate to an arc detection.

Whenever "arc" is mentioned in this description, all types of arc are included. Special advantages of the invention are obtained, however, when it is applied to micro arcs.

When an arc detection is present for one power supply only, in which case the arc detection can be implemented in the power supply or separately therefrom, then a corresponding signal can be transferred from the one power supply to the other power supplies, so that all power supplies are able to implement a counter-measure simultaneously, preferably the same counter-measure. In that case, one power supply is operated as master and the other power supplies are operated as slaves.

An arc detection can be carried out for each power supply and a signal relating to the arc detection or data relating to the arc detection can be generated.

Information about the plasma process can thus be provided at the locations of the respective power supplies.

The signal relating to the arc detection generated for a power supply and/or the generated data relating to the arc detection can be transferred to the respective other power supplies and/or to the plasma process-regulating device. Taking account of these signals and/or data, the other power supplies can initiate corresponding measures or perform algorithms, so that a homogeneous plasma process is maintained. Alternatively or additionally, a plasma process-regulating device can, by taking account of the signals and/or data, regulate the plasma process in such a way that a homogeneous coating or a homogeneous, uniform etching is effected.

A counter-measure can be initiated as a response to the detection of one or more arcs. Inter alia, the further supply of power into an arc can be suppressed. On detection of a micro arc, a brief polarity reversal can be carried out as a counter-measure, in order to avoid the development of a "hard arc".

Information about counter-measures that have been implemented and/or the frequency of detected arcs can be transferred as data relating to the arc detection. The data can include information about the number and/or duration of polarity reversals or OFF times of the power supply and/or information about the energy produced by the power supply.

Furthermore, for at least one power supply, a check can be made to determine whether a number or duration of implemented counter-measures was lower or shorter, respectively, than in the case of other power supplies, and when a predefined duration or number is fallen below, measures can be taken to increase the duration or number. This can mean that the threshold value with which a characteristic value for arc detection is compared is set to be more sensitive. In addition, a specific periodic or aperiodic pulsing can be carried out. Moreover, for arc detection, it is possible to use further characteristic values, which lead to an even more sensitive detection of arcs or micro arcs. Moreover, the duration of implemented counter-measures, for example, the polarity reversal duration, can be extended. In addition, a blocking time that elapses before a counter-measure is initiated can be changed. The result of these measures can be that the OFF times or polarity reversal times of the power supplies are matched to one another. The outcome is a more uniform coating or a more uniform etching.

In addition, it is possible for the power of the overall process to be reduced. Furthermore, a control of the speed at which a substrate passes through the plasma process, or the dwell time in the plasma process could be changed.

As already mentioned, on detection of an arc or micro arc for a power supply, a counter-measure can be initiated at this power supply and the other power supply/supplies. Initiation of the counter-measures is thereby synchronized.

Furthermore, it is possible for the signal relating to the arc detection to be released only when a counter-measure is implemented and the other power supplies thereupon likewise implement a counter-measure. The other power supplies can detect this signal and respond to it in accordance with their own algorithms. One possible algorithm would be that after their own blocking time has expired, a polarity reversal likewise takes place. Furthermore, if their own blocking time has not expired, that is if the signal arrives at a time when their own blocking time still is running, a polarity reversal response could occur immediately after expiry of the blocking time.

An especially simple synchronization and homogenization of the plasma process can be effected when one power supply is operated as master and one or more other power supplies are operated as slave(s).

The plasma process or plasma processes taking place in the plasma chamber lead to a plasma processing, for example, of a substrate or a workpiece. If different power supplies respond differently to arcs, the plasma processes may differ, for example, by having different sputtering rates, so that the plasma processing becomes non-uniform. To counteract this, a measure promoting the homogeneity of the plasma processing can be initiated or implemented. Such a measure can be initiated or carried out on the basis of the signals and/or data relating to the arc detection.

The measures promoting the homogeneity of the plasma processing can include:

setting the arc detection threshold (threshold value with which a characteristic value is compared) for one or more power supplies;

specific periodic or aperiodic pulsing of one or more power supplies;

specific pulsing for a limited period, commonly called a pulse burst;

inclusion of further characteristic values for arc detection;

setting the polarity reversing voltage or duration or OFF time for one or more power supplies;

changing a blocking time;

reducing the overall power of the system;

controlling the power of individual power supplies;
regulating the feed rate and/or the dwell time of the substrates in the plasma chamber.

This list indicates merely examples of possible measures. Other measures are naturally also possible and are also covered by the present invention.

If the counter-measures of at least two power supplies are synchronized, this contributes to the homogenization of the plasma process.

If at least one of the power supplies is operated in pulsed mode, the occurrence of arcs can be reduced. In order to achieve a high deposition rate, a power supply can be pulsed at a relatively low pulse rate, so that power is delivered to the plasma process for as long a time as possible. If a further power supply is operated with micro arc detection technology (see below), the deposition rate can be optimized.

Arc detection can be effected, for example, as follows: at least a first characteristic value (CV) of the plasma process is monitored, by comparing the at least one first characteristic value with a predefinable first threshold value and, when the first threshold value is reached, by detecting a potential arc discharge and by initiating a first counter-measure to suppress the arc discharge, wherein the at least one first characteristic value and/or at least one second characteristic value is compared with a predefinable second threshold value, which is different from the first threshold value, and, when the second threshold value is reached, a second counter-measure for suppressing arc discharge is initiated and, after the second counter-measure has been initiated, during a blocking time renewed initiation of the second counter-measure is prevented.

In a further aspect, the invention relates to a plasma system for carrying out the method according to the invention, having at least two power supplies, a plasma chamber and at least one arc detection device, which is assigned to one of the power supplies, the power supplies being connected via a signal link and/or data link to one another and/or to a plasma process-regulating device.

U.S. provisional application 60/867,159, the contents of which are herewith incorporated as subject matter of this application, describes a plasma power supply, which comprises an arc interface unit, by means of which an arc diverter control means or an arc diverter can be quickly and directly influenced.

The power supplies can comprise an input device, in particular including an arc input, which can be in the form of a micro arc input, and/or an output device, in particular including an arc output, which can be in the form of a micro arc output. If an arc is detected for one power supply, then an arc detection signal can be applied to the output of this power supply and transferred to the arc inputs of the other power supplies. The arc detection is now effective for all current supplies like their own detection of an arc. When the predefinable blocking time has expired, a counter-measure is implemented as a response to this arc detection. If the arc detection is not effected in the power supplies themselves, signals of external arc detection devices can be transmitted to the arc input, to be exact, both a signal of the arc detection device assigned to one power supply as well as signals from arc detection devices that are assigned to other power supplies.

One port of the power supplies can be in the form of an input and output device, in particular an input and output port. This includes the possibility that the input/output port is in the form of an open-collector connection and the open-collector connections of the power supplies are interconnected. The voltage at this output/input can be maintained at a high potential, for example, with 100 kΩ at 5 volts, with a resistor. An electronic switch, for example, a transistor, can short-circuit this port to earth. Many ports of this kind (namely, of different power supplies) can be interconnected via a cable. If just a single one of the switches, the switch of just one power supply, short-circuits the port, then at all ports a voltage change from high potential (5V) to low potential (close to 0V) can be measured. In this way, power supplies can be interconnected with one arc input/output port. The power supplies' own arc detection in each case acts on the switches so that they bring the arc input/output port to close to 0V. Monitoring of the port then constitutes the actual arc detection.

The duration of the blanking out can be signaled via such a port by the duration of the pulse of the signal change at the port. In this way, the current supplies can be even better synchronized.

External signals can also be applied to such a port, in an extreme case even a periodic pulse signal. But in that case, the functionality of the micro arc detection technology, which is improved compared with periodic pulsing, would not be utilized.

The power supplies can comprise an arc interface unit, in which a characteristic value of the plasma process is monitored. The arc detection can be effected in this arc interface unit. In addition, the signals and data relating to the arc detection can be generated there and be output via the arc interface unit. In addition, signals and data of other power supplies can be received.

The arc detection can be a micro arc detection. Micro arc detection is distinguished by the detection of micro arcs and, if necessary, initiation of counter-measures, at very low arc energies. Until now, there has generally been no response at all to such micro arcs, and often they were undetected. If there is now a response to such micro arcs in order to stabilize the plasma process, then synchronization is extremely important.

One embodiment can be what is commonly termed multi-level arc detection technology (also called micro arc detection technology). This technology is known, for example, from U.S. provisional application 60/861,115 or EP 06024306, the contents of which are herewith incorporated as subject matter of this application. These publications describe a technology, in which instead of periodic pulsing, a counter-measure is initiated only when so-called micro arcs are detected, for example, the polarity of a voltage is reversed for a pre-definable short time, and following such a counter-measure a renewed counter-measure is suppressed for a pre-definable blocking time, even if there is a new detection of a micro arc. In this way, a very much higher coating or ablation rate is achieved than is the case with periodic pulsing. In addition, the degree of contamination can be read off by means of the pulse repetition rate. The pulse repetition rate corresponds to the frequency of the counter-measures implemented.

In plasma processes in which previously a plurality of periodically pulsed power supplies were used independently of one another, the new micro arc detection technology cannot automatically be used as a replacement for periodic pulsing (i.e. periodic switching off of the power supply or suppression of the power supply to a plasma process). This is associated with the unpredictability of the micro arcs. If, for example, two plasma processes are fed from respective periodically pulsed power supplies, each of which have been set to the same frequency and the same polarity reversal duration, then a common, largely predictable coating result is achieved with these two power supplies. If the same was attempted with two power supplies with micro arc detection technology, then the two power supplies and hence the two plasma processes would operate at the same pulse rates only at random. In an extreme case, the one power supply would operate at a very high pulse rate and the other in virtually continuous operation. This can lead to unpredictable and possibly undesirable results in the coating rates. The described synchronization can counteract this in a positive way.

Each power supply can be assigned an arc diverter. The arc diverter can be designed to implement different counter-measures on detection of an arc or micro arc. It can effect a polarity reversal of the power supply or a disconnection of a power supply.

FIG. 1 shows a plasma chamber 10 with three electrodes 11, 12, 13. A substrate 14 is passed on rollers 15 through the plasma chamber 10 and is coated as far as possible with predictable uniformity by all electrodes 11-13. The power supply 20 supplies the electrode 11 with power and accordingly generates a plasma in the area surrounding the electrode 11. The power supplies 21 and 22 do the same with the electrode 12 and electrode 13 respectively. Thus, three plasma processes 17, 18 and 19 are operated in the plasma chamber 10 and lead to plasma processing of the substrate 14.

Each power supply comprises an arc interface device 23, 24, 25 with an input/output (IN/OUT) device 26-28. These devices 26-28 can each be embodied in one electrical connection; alternatively, there can be several connections.

Figure 2:
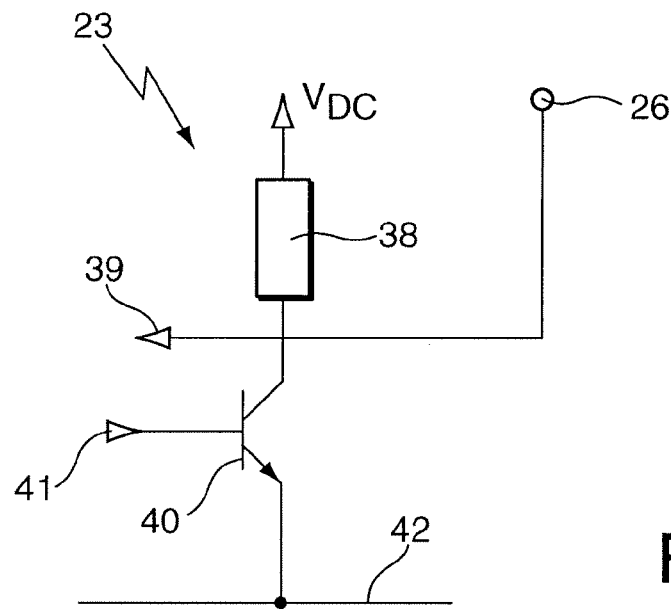
FIG. 2 shows a schematic representation of an arc interface device.

Should there be just one connection, a device according to FIG. 2 can be used.

The power supplies 20-22, in particular the arc interface devices 23-25, are interconnected via a data line and/or signal line 29, so that signals and/or data can be exchanged. This data can be factored in by the individual power supplies 20-22 in order to be able to achieve a coating that is as uniform as possible. The data line and/or signal line 29 can be in the form of a data bus.

Furthermore, the power supplies 20-23 can be connected via a data link to a plasma process-regulating device 30. Data that relates to the arc detection is relayed to the plasma process-regulating device 30. This is able to regulate the entire process so that the substrate 14 is processed as uniformly as possible.

The power supply 20 can be in the form of a master power supply, so that upon arc detection by the power supply 20, for example, when a monitored characteristic value reaches a threshold value, counter-measures are implemented by all power supplies 20-22. The power supplies 21, 22 are in this case operated as slaves. This means that in these power supplies 21, 22 either no arc detection is carried out, or an arc detection carried out there can have no effect on the other power supplies.

In an alternative embodiment, for example, the power supply 20 can carry out an arc detection by comparing a first characteristic value with a first threshold value and the power supply 21 can carry out an arc detection by comparing a second characteristic value with a second threshold value. The arc detection of the two power supplies 20, 21, and in particular counter-measures initiated thereby, can be synchronized. This procedure can also be expanded to three or more power supplies 20-22.

In FIG. 2, an arc interface device 23 is shown in detail. The voltage across the input/output device 26, which is here a single electrical connection, is firstly monitored, indicated by the reference arrow 39. Secondly, the voltage across the input/output device 26 is brought via a relatively high-impedance resistor 38 (1-1000 kΩ) to a potential $V_{DC}$. A control signal 41 controls an electronic switch 40, here a bipolar transistor. When the control is not active, the transistor is in a state of high-impedance, (with an even higher impedance than the resistor) and the voltage across the input/output device 26 lies approximately at the potential VDC. When the control is active, the transistor is in a low-impedance state (with a clearly lower impedance than the resistor), and the voltage across the input/output device 26 lies approximately at earth potential 42. This voltage change is measured at 39. If several such input/output devices 26 are interconnected by respective different power supplies, then whenever one of the power supplies draws this input/output device 26 to earth potential 42, each power supply recognizes that one of the power supplies has detected an arc. Thus, all power supplies receive an arc detection signal.

In this case, depending on how an arc diverter 45-47 (FIG. 1) is configured, a counter-measure can be initiated immediately, or the device can first wait for a blocking time and then a counter-measure can be initiated. Because the power supplies 20-22 are interconnected via the data line and/or signal line 29, these measures can be implemented in synchrony, since all power supplies 20-22 receive the arc detection signal virtually simultaneously. In FIG. 1, the arc diverters 45-47 are shown as part of the power supplies 20-22. This is not obligatory. They may alternatively be provided as separate devices, which are merely assigned to the power supplies 20-22.

Figure 3:
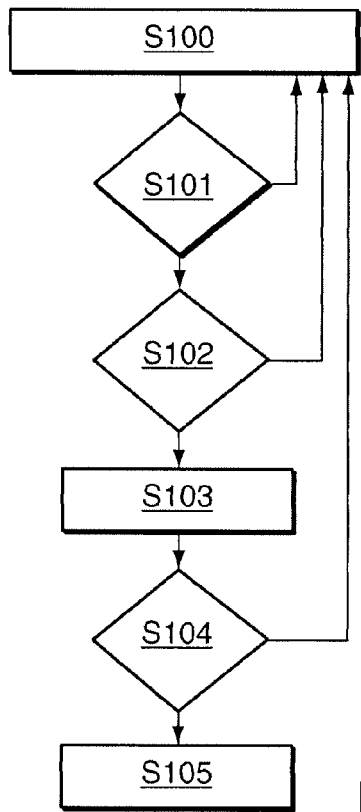
FIG. 3 shows a flow chart to illustrate a first process variant.

FIG. 3 shows a flow chart to illustrate a first process variant. In a first step S100, a power supply, or an arc detection device associated with the power supply, carries out a micro arc detection, for example, by comparing one or more characteristic values of the plasma process with one or more threshold values. If it is detected in step S101 that a micro arc is present, then step S102 checks whether a pre-defined blocking time, during which no counter-measure may be initiated, has elapsed. In case of affirmation, in step S103 a counter-measure is initiated and data relating to the arc detection, for example, the duration or the frequency of the counter-measures, is issued. In step S104, a comparison with the duration or frequency of the counter-measures in the case of other power supplies is carried out. If it is found that the counter-measures of the other power supplies are longer or more frequent, in step S105 a measure promoting the homogeneity of the plasma processing is implemented. The method of FIG. 3 is carried out for several power supplies. If the polling in steps S101, S103 and S104 produces a negative result, then in each case the method proceeds to step S100.

In other words, synchronization of the power supplies is effected as follows:

An exchange of the number and duration of polarity reversals or an exchange of the OFF-times takes place. If one of the power supply OFF-times lies by a predefinable value below the others, then counter-measures that lead to a higher OFF-time are taken, for example, the micro arc threshold value is set to be more sensitive. Alternatively or additionally, a specific periodic or aperiodic pulsing of the power supply can be effected. Other characteristic values can be taken into account, to achieve an even more sensitive detection of micro arcs. The polarity reversal duration can be changed, in particular extended. The blocking time can be changed. Furthermore, the power can be reduced. In the overall control of the plasma process, regulation of the speed at which a substrate is passed through the plasma process could be included.

Figure 4:
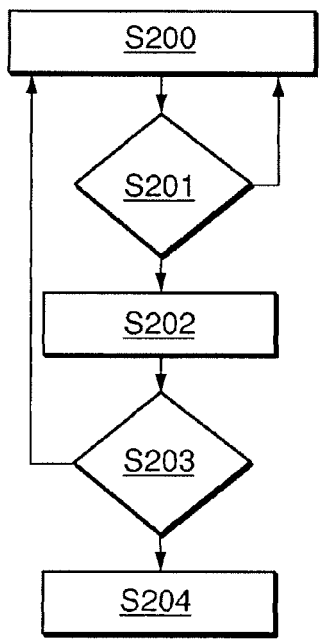
FIG. 4 shows a flow chart to illustrate a second process variant.

FIG. 4 shows a flow chart to illustrate a second process variant. In a first step S200, a power supply, or an arc detection device associated with the power supply, carries out a micro arc detection, for example, by comparing one or more characteristic values of the plasma process with one or more threshold values. If it is detected in step S201 that a micro arc is present, or that an arc detection signal of a different power supply has been received, then in step S102 an arc detection signal is changed, respectively passed to the other power supplies. If necessary, a differentiation can be performed as to whether a local arc detection is involved or whether an arc detection signal of a different power supply is present. In the latter case, step S202 can be skipped and the method can proceed directly from S201 to S203. In step S203, a check is run to determine whether a pre-defined blocking time, during which no counter-measure may be initiated, has elapsed. In case of affirmation, in step S204 a counter-measure is initiated. In step S205 a check is run to determine whether an arc detection signal of a different power supply has been received. In case of affirmation, step S203 is skipped and a check is run to determine whether a blocking time has elapsed. If the polling in steps S201 and S203 produces a negative result, then in each case the method proceeds to step S200.

This process variant can also be described as follows:

On detection of a micro arc, a micro arc detection signal is displayed at the output of the power supply. This output is applied to an input of the other power supplies. The micro arc detection is now effective for all power supplies like their own detection of a micro arc. When the predefinable blocking time has elapsed, the response to this micro arc detection is a first counter-measure.

Figure 5:
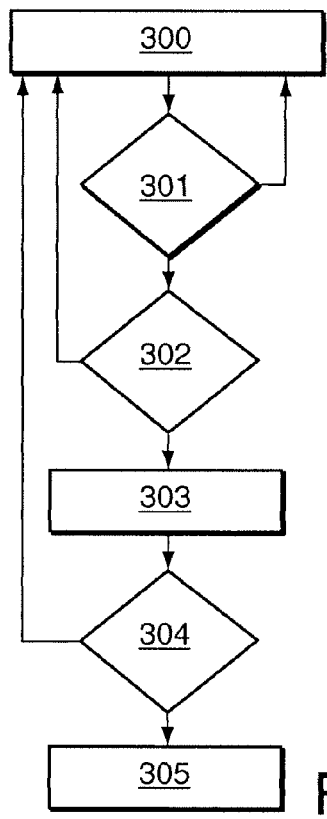
FIG. 5 shows a flow chart to illustrate a third process variant.

FIG. 5 shows a flow chart to illustrate a third process variant. In a first step S300, a power supply, or an arc detection device associated with the power supply, carries out a micro arc detection, for example, by comparing one or more characteristic values of the plasma process with one or more threshold values. If it is recognized in step S301 that a micro arc is present, or that an arc detection signal of a different power supply has been received, then in step S302 a check is run to determine whether a pre-defined blocking time, during which no counter-measure may be initiated, has elapsed. In case of affirmation, in step S303 a counter-measure is initiated. In step S304 a check is run to determine whether the counter-measure has been effected on the basis of local arc detection. In case of affirmation, an arc detection signal in step S305 is changed or transferred to the other power supplies. If the polling in steps S301, S302 and S304 produces a negative result, then in each case the process skips to step S300.

Compared with the process variant according to FIG. 4, this means that instead of emitting a signal upon micro arc detection, a signal is also emitted "only on" or "not until" initiation of the counter-measure (for example, polarity reversal), and this signal can be supplied to the other power supplies. The other power supplies detect this signal and respond to it according to their own algorithms. One possible algorithm would be, for example: when a power supply's own blocking time has elapsed, a polarity reversal likewise takes place. When a power supply's own blocking time has not elapsed, then the response immediately after elapse of the blocking time is a polarity reversal.

What is claimed is:

1. A method of operating at least one plasma process with at least two power supplies, the method comprising:
   carrying out an arc detection for a first power supply;
   generating a signal relating to the arc detection;
   transferring the signal to a second power supply, a plasma process regulating device, an arc diverter device associated with the second power supply, or a combination thereof;
   determining a fewer number or shorter duration of counter-measures carried out for the second power supply relative to a number or duration of counter-measures carried out for the first power supply; and
   responsive to the number or duration falling below a pre-defined value, increasing the number or duration of counter-measures carried out for the second power supply.

2. The method of claim 1, wherein the signal is a data signal.

3. The method of claim 2, wherein the data signal includes information relating to the arc detection selected from the group consisting of:
   a frequency of detected arcs,
   counter-measures implemented,
   number of polarity reversals of the first power supply,
   duration of the polarity reversals of the first power supply,
   number of OFF-times of the first power supply,
   duration of OFF-times of the first power supply,
   energy generated by the first power supply, and
   combinations thereof.

4. The method of claim 1, further comprising carrying out a corresponding arc detection for the second power supply and generating a corresponding signal relating to the arc detection for the second power supply.

5. The method of claim 4, wherein the signal relating to the arc detection for the second power supply is transferred to the first power supply, the plasma process regulating device, an arc diverter device associated with the first power supply, or a combination thereof.

6. The method of claim 1, wherein a counter-measure is initiated responsive to detecting one or more arcs.

7. The method of claim 1, wherein a measure promoting the homogeneity of the plasma processing is initiated or implemented in response to the transferred signal relating to the arc detection.

8. The method of claim 7, wherein the measure promoting the homogeneity of the plasma process is selected from the group consisting of:
   setting an arc detection threshold for at least one of the power supplies,
   specific periodic or aperiodic pulsing of at least one of the first and second power supplies,
   specific pulsing for a limited period,
   inclusion of further plasma process characteristic values for arc detection,
   setting a polarity reversing voltage for at least one of the first and second power supplies,
   setting a polarity reversing duration for at least one of the first and second power supplies,
   setting a polarity reversing OFF time for at least one of the first and second power supplies,
   changing a blocking time,
   reducing overall power of a plasma system including the first and second power supplies,
   controlling power of at least one of the power supplies,
   regulating a feed rate of substrates in a plasma chamber,
   regulating a dwell time of substrates in the plasma chamber, and
   combinations thereof.

9. The method of claim 1, further comprising synchronizing counter-measures of the first and second power supplies.

10. The method of claim 1, wherein at least one of the first and second power supplies is operated in pulse mode.

11. The method of claim 1, wherein increasing the number, duration, or combination thereof of counter-measures carried out for the second power supply includes setting an arc detection threshold for the second power supply to increase arc detection sensitivity.

12. A method of operating at least one plasma process with at least two power supplies, the method comprising:

carrying out an arc detection for a first power supply;
generating a signal relating to the arc detection;
transferring the signal to a second power supply, a plasma process regulating device, an arc diverter device associated with the second power supply, or a combination thereof;
determining counter-measures carried out for the second power supply are of a smaller number, shorter duration, or a combination thereof relative to counter-measures carried out for the first power supply; and
responsive to the determination, increasing the number, duration, or a combination thereof of counter-measures carried out for the second power supply when a corresponding threshold is crossed.

13. The method of claim 12, further comprising:
carrying out a corresponding arc detection for the second power supply;
generating a corresponding signal relating to the arc detection for the second power supply; and
transferring the signal relating to the arc detection for the second power supply to the first power supply, the plasma process regulating device, an arc diverter device associated with the first power supply, or a combination thereof.

14. The method of claim 13, wherein increasing the number, duration, or combination thereof of counter-measures carried out for the second power supply includes setting an arc detection threshold for the second power supply to increase arc detection sensitivity.

15. A plasma system comprising:
at least two power supplies;
a plasma chamber; and
at least one arc detection device assigned to one of the power supplies, the power supplies being connected via one of a signal link and a data link to one of another power supply and a plasma regulating device, and each of the power supplies having an arc interface unit, in which data relating to the arc detection selected from the group consisting of: information about counter-measures implemented and a frequency of detected arcs is generated and is output therefrom;
wherein the system is configured such that for at least one power supply there is a check as to whether a lower number or shorter duration of counter-measures than for other power supplies was carried out, and, when a predefined number or duration, respectively, is fallen below, measures to increase the number or duration, respectively, are implemented.

16. The plasma system of claim 15, wherein the power supplies are connected via one of the signal link and the data link to both the plasma process-regulating device and to one another.

17. The plasma system of claim 15, wherein the power supplies comprise an input device and an output device.

18. The plasma system of claim 17, wherein the input device is an arc input and the output device is an arc output.

19. The plasma system of claim 15, wherein each of the power supplies include an input/output port.

20. The plasma system of claim 19, wherein the input/output port is in the form of an open-collector connection and the open-collector connections of the power supplies are interconnected.

* * * * *